United States Patent
Kim

(10) Patent No.: US 11,075,142 B2
(45) Date of Patent: Jul. 27, 2021

(54) COOLING APPARATUS FOR POWER SEMICONDUCTOR AND A METHOD OF MANUFACTURING THE SAME

(71) Applicants: Hyundai Motor Company, Seoul (KR); Kia Motors Corporation, Seoul (KR)

(72) Inventor: Seok-Jun Kim, Seoul (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 16/696,011

(22) Filed: Nov. 26, 2019

(65) Prior Publication Data

US 2021/0066163 A1    Mar. 4, 2021

(30) Foreign Application Priority Data

Sep. 2, 2019    (KR) .......................... 10-2019-0108126

(51) Int. Cl.
| | |
|---|---|
| *H01L 21/00* | (2006.01) |
| *H01L 23/34* | (2006.01) |
| *H01L 23/427* | (2006.01) |
| *H01L 21/48* | (2006.01) |

(52) U.S. Cl.
CPC ........ *H01L 23/427* (2013.01); *H01L 21/4882* (2013.01)

(58) Field of Classification Search
CPC ............. H01L 21/4871; H01L 21/4882; H01L 23/427; H01L 23/49568; H01L 33/64; H01L 35/30
USPC .......... 438/122; 257/625, 675, 706, 714–721
See application file for complete search history.

(56) References Cited

U.S. PATENT DOCUMENTS

| | | | | |
|---|---|---|---|---|
| 7,808,785 | B2 * | 10/2010 | Meier ................ | H01L 23/4093 |
| | | | | 361/704 |
| 10,306,804 | B2 * | 5/2019 | Chester ............. | H05K 7/20218 |
| 10,410,953 | B2 * | 9/2019 | Momose ................ | H01L 23/28 |
| 2017/0341638 | A1 * | 11/2017 | Sawada ................... | H01L 23/46 |

* cited by examiner

*Primary Examiner* — Calvin Lee
(74) *Attorney, Agent, or Firm* — Morgan, Lewis & Bockius LLP

(57) ABSTRACT

A cooling apparatus for a power semiconductor includes a cooler having a cooling path so that a cooling medium flows therein, and an auxiliary cooling plate of a multi-layered structure joined to a surface of the cooler with which the power semiconductor comes into contact. A method of manufacturing the cooling apparatus includes providing an auxiliary cooling plate of a multi-layered structure, providing a cooler having a cooling path so that a cooling medium flows therein, and joining the auxiliary cooling plate to a surface of the cooler with which the power semiconductor comes into contact, wherein the providing a cooler and the joining the auxiliary cooling plate are performed together in the same brazing process, so that a manufacture of the cooler and the joining the auxiliary cooling plate are simultaneously performed.

6 Claims, 3 Drawing Sheets

FIG 1A -RELATED ART-
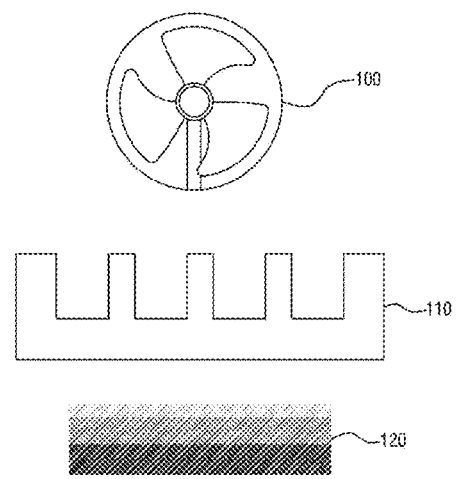
FIG 1B -RELATED ART-
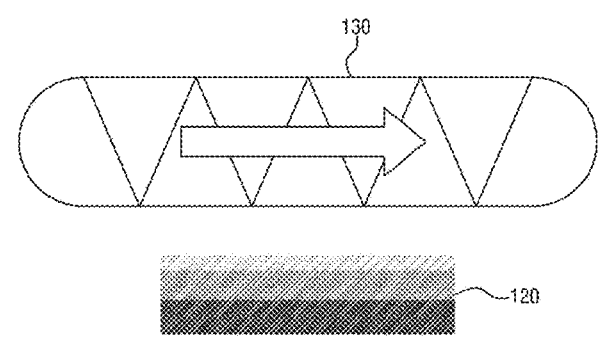
FIG 1C -RELATED ART-
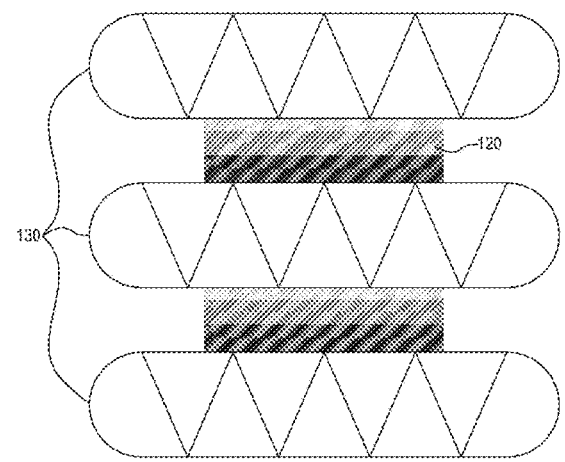

COOLING APPARATUS FOR POWER SEMICONDUCTOR AND A METHOD OF MANUFACTURING THE SAME

CROSS-REFERENCE TO RELATED APPLICATION(S)

The present application claims the benefit of priority under 35 U.S.C. § 119 to Korean Patent Application No. 10-2019-0108126, filed on Sep. 2, 2019 in the Korean Intellectual Property Office, the disclosure of which is incorporated herein by reference in its entirety.

BACKGROUND

The present disclosure relates to a cooling apparatus for a power semiconductor and a method of manufacturing the cooling apparatus. More particularly, the present disclosure relates to an aluminum cooling apparatus for a power semiconductor to which an auxiliary cooling plate is joined and a method of manufacturing the cooling apparatus.

A battery is installed in an eco-friendly car such as a hybrid car or an electric car to supply power to a generator, a drive motor or the like. The battery is connected to a power semiconductor. The power semiconductor refers to a semiconductor that regulates voltage and current, and boosts input voltage to reduce current applied to the system and thereby improve the performance of the drive motor. Such a power semiconductor is used in an inverter or the like and is recently receiving attention as a key component of the eco-friendly car.

However, the power semiconductor of the inverter of the eco-friendly car generates a large quantity of heat while controlling power. Since energy efficiency is lowered in proportion to the quantity of the generated heat, a cooling apparatus is required. That is, in order to improve the performance of the power semiconductor, a cooler is installed in the power semiconductor. The cooler cools the power semiconductor by causing a cooling medium to flow therein.

Generally, a cooling method may include an air cooling method or a water cooling method. However, as the quantity of power required by a vehicle increases gradually, the quantity of the generated heat likewise increases. Currently, most of the cooling method utilizes the water cooling method. In order to improve the efficiency, methods of applying a double-sided cooling method are proposed.

The double-sided cooling method may have improved cooling performance as compared to the single-sided cooling method. However, there is no difference between the double-sided cooling method and the single-sided cooling method in performance for transferring heat from the power semiconductor to the cooler. Therefore, an auxiliary cooling plate may be applied to improve the heat transfer performance from the power semiconductor to the cooler.

The auxiliary cooling plate may have a structure in which two metal layers are combined with each other, and may include a copper layer that has excellent heat transferring capability and a filler layer that joins the plate to an aluminum cooler. That is, the copper layer functions to improve heat dissipation performance using high heat conductivity and latent heat, while the filler layer is used to be joined to the aluminum cooler in brazing. According to an embodiment, the filler layer may be made of aluminum.

When the above-described auxiliary cooling plate of the two-layered structure is joined to the aluminum cooler, partial melting and puncturing of an aluminum cooler side occur at a joining interface between the aluminum cooler and the auxiliary cooling plate. According to the result of the joining experiment, an interface reaction where melting and puncturing occur under various brazing temperature and time conditions may not be controlled and thus a good joining state may not be obtained.

The reason why the melting and the puncturing occur is as follows: a process reaction occurs at a temperature of about 548° C. which is much lower than the melting point of each of copper and aluminum, and the aluminum cooler side forming the joining interface is melted as the process reaction occurs in a brazing joining operation between the aluminum cooler and the auxiliary cooling plate.

The information included in this Background section is only for enhancement of understanding of the general background of the present disclosure and may not be taken as an acknowledgement or any form of suggestion that this information forms the prior art already known to a person skilled in the art.

SUMMARY

The present disclosure has been made in an effort to solve the above-described problems associated with prior art. An object of the present disclosure is to prevent an interface reaction from occurring when an auxiliary cooling plate of a two-layered structure composed of a copper layer and a filler layer is brazing welded to an aluminum cooler.

The technical objects which are to be achieved by the present disclosure are not limited to the above-mentioned technical objects, and other technical objects which are not mentioned above will be clearly understood by those skilled in the art from the following detailed description of the present disclosure.

In one aspect of the present disclosure, a cooling apparatus for a power semiconductor includes a cooler having a cooling path so that a cooling medium flows therein; and an auxiliary cooling plate of a multi-layered structure joined to a surface of the cooler with which the power semiconductor comes into contact.

The cooler may be made of aluminum, and the auxiliary cooling plate may have a multi-layered structure including a copper layer; a reaction preventing layer disposed on the copper layer to prevent an interface reaction between a copper component of the copper layer and an aluminum component of the cooler; and a filler layer disposed on the reaction preventing layer to be joined to the aluminum cooler.

In another aspect of the present disclosure, a method of manufacturing a cooling apparatus for a power semiconductor includes providing an auxiliary cooling plate of a multi-layered structure; providing a cooler having a cooling path so that a cooling medium flows therein; and joining the auxiliary cooling plate to a surface of the cooler with which the power semiconductor comes into contact, wherein the providing a cooler and the joining the auxiliary cooling plate may be performed together in a same brazing process, so that a manufacture of the cooler and the joining the auxiliary cooling plate may be simultaneously performed.

The providing a cooler may be performed by an aluminum brazing process, and the providing the auxiliary cooling plate may include providing a copper layer; forming a reaction preventing layer on the copper layer to prevent an interface reaction between a copper component of the copper layer and an aluminum component of the cooler; and forming a filler layer, which is to be joined to the aluminum cooler, on the reaction preventing layer.

The reaction preventing layer may be made of metal that allows a phase change reaction temperature when dissimilar metal components of the reaction preventing layer come into contact with each other to be higher than a phase change reaction temperature when a copper component of the copper layer comes into contact an aluminum component of the aluminum cooler.

A metal component of the reaction preventing layer may be steel or nickel (Ni).

BRIEF DESCRIPTION OF THE DRAWINGS

Hereinafter, the accompanying drawings are intended to aid in understanding the present disclosure, and provide embodiments of the present disclosure along with the detailed description. However, the technical features of the present disclosure are not limited to specific drawings, and features disclosed in respective drawings are combined with each other to constitute a new embodiment.

FIGS. 1A and 1B are schematic views illustrating air-cooling and water-cooling types of cooling methods for a heating element according to the related art;

FIG. 1C is a schematic view illustrating a water-cooling type of double-sided cooling method according to the related art;

DETAILED DESCRIPTION

Figure 2:
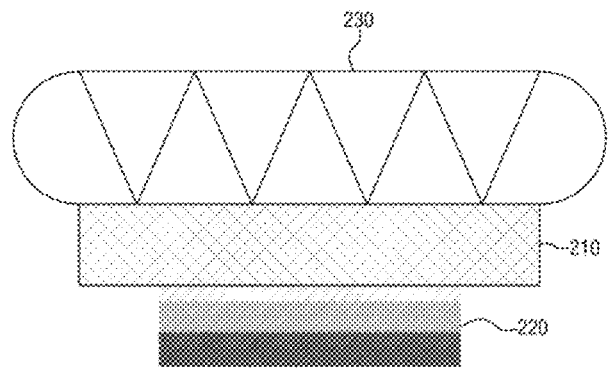
FIG. 2 is a schematic view illustrating an inverter structure in which a power semiconductor is assembled with a cooling apparatus to which an auxiliary cooling plate is joined, according to an exemplary embodiment of the present disclosure.

Hereinafter, various exemplary embodiments of the present disclosure will be described in detail with reference to the drawings. However, the present disclosure is not limited to those exemplary embodiments. Like reference numerals in the drawings denote members that perform substantially the same function.

The objects and effects of the present disclosure may be naturally or more clearly understood by the following description, but the objects and effects of the present disclosure are not limited only by the following description. Furthermore, in the description of the present disclosure, if it is determined that the detailed description of the known technology related to the present disclosure may unnecessarily obscure the subject matter of the present disclosure, the detailed description thereof will be omitted.

FIGS. 1A and 1B are schematic views illustrating air-cooling and water-cooling types of cooling methods for a heating element according to the related art.

According to the air-cooling type of cooling method illustrated in FIG. 1A, a heating element 120 such as a power semiconductor is cooled by circulating air using a heat dissipation plate 100 and a fan 100. In contrast, according to the water-cooling type of cooling method illustrated in FIG. 1B, cooling water circulating in a cooler 130 absorbs heat generated from the heating element 120 such as the power semiconductor and then releases the heat to the atmosphere, thus cooling the heating element 120.

FIG. 1C is a schematic view illustrating a water-cooling type of double-sided cooling method according to the related art. FIG. 1B illustrates the water-cooling type of single-sided cooling method. In order to improve the cooling efficiency of such a single-sided cooling method, the double-sided cooling method of FIG. 1C is applied. Referring to FIG. 1C, the double-sided cooling method is a method of placing coolers 130 on both sides of the heating element 120 such as the power semiconductor. For example, when applying the double-sided cooling method using the aluminum cooler, the cooling performance may be improved by about 60% as compared to the case of using the single-sided cooling method.

However, improvement of cooling performance is achieved by simply changing the cooling method from the single-sided cooling method to the double-sided cooling method. There is no difference in performance of transferring heat from the power semiconductor to the cooling apparatus between the single-sided cooling method and the double-sided cooling method. In consideration of this point, the present disclosure proposes a method that improves the cooling performance by maximizing the heat transfer effect from the power semiconductor to the cooling apparatus.

According to an exemplary embodiment of the present disclosure, the inverter structure made by assembling the power semiconductor with the cooling apparatus to which the auxiliary cooling plate is joined is schematically illustrated in FIG. 2. Referring to FIG. 2, the inverter structure according to an exemplary embodiment of the present disclosure is characterized in that the auxiliary cooling plate 210 is joined to the cooler 230 having the cooling path so that the cooling medium flows. According to an exemplary embodiment of the present disclosure, the cooler 230 may be the aluminum cooler. As illustrated in FIG. 2, the auxiliary cooling plate 210 may be joined to a surface of the cooler 230 with which the power semiconductor 220 is to come into contact. As such, according to an exemplary embodiment of the present disclosure, the cooler 230 to which the auxiliary cooling plate 210 is joined, that is, the cooling apparatus for the power semiconductor according to the embodiment of the present disclosure is assembled with the power semiconductor 220, thus forming the inverter.

Figure 3:
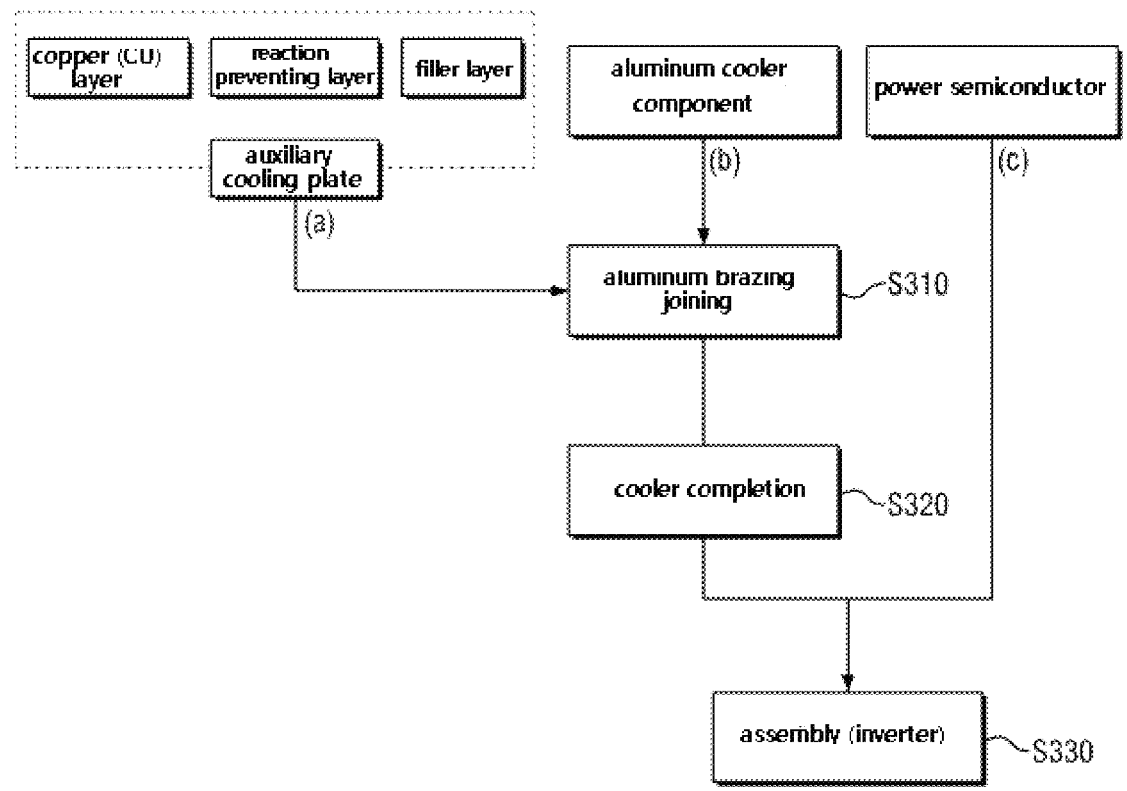
FIG. 3 is a flowchart illustrating an assembling process of an inverter including a cooling apparatus for a power semiconductor, according to an exemplary embodiment of the present disclosure.

FIG. 3 is a flowchart illustrating an assembling process of the inverter including the cooling apparatus for the power semiconductor according to an exemplary embodiment of the present disclosure as illustrated in FIG. 2. In this regard, according to the conventional inverter assembling process, the aluminum cooler is manufactured by the brazing method. The aluminum cooler manufactured in this way is assembled with the power semiconductor, thus completing the inverter.

According to an exemplary embodiment of the present disclosure, the auxiliary cooling plate (portion 'a' of FIG. 3) may be applied in the conventional process of manufacturing the aluminum cooler. As illustrated in FIG. 3, the auxiliary cooling plate 210 may be composed of a copper layer, a reaction preventing layer, and a filler layer. The configuration of such an auxiliary cooling plate 210 will be described in detail later.

Furthermore, according to an exemplary embodiment of the present disclosure, the brazing joining may be used to firmly join the above-described auxiliary cooling plate a to the cooler. According to the embodiment, the cooler may include an aluminum cooler component b, and the brazing joining may be aluminum brazing joining at step S310. The brazing joining between the auxiliary cooling plate a and the cooler is realized by assembling the auxiliary cooling plate a with the cooler in the cooler brazing operation without using a separate process. Therefore, according to an exemplary embodiment of the present disclosure, the cooler to which the auxiliary cooling plate is joined does not require an additional process in the manufacture at step S320. The cooling apparatus (i.e. the cooler to which the auxiliary cooling plate is joined) according to an exemplary embodiment of the present disclosure manufactured as such is assembled with the power semiconductor to constitute the inverter at step S330.

As described above, in order to maximize the heat transfer effect from the power semiconductor to the cooler in the present disclosure, a method of applying the auxiliary cooling plate between the cooler and the power semiconductor is used. Hereinafter, the configuration and function of the auxiliary cooling plate according to an exemplary embodiment of the present disclosure will be described in detail.

The three-layered structure of the auxiliary cooling plate according to an exemplary embodiment of the present disclosure is a structure composed of several metal layers, and essentially includes a copper layer 520 having excellent heat transferring capability and a filler layer 510 joined to the aluminum cooler. A reaction preventing layer 500 for preventing the above-described interface reaction is further added between the copper layer 520 and the filler layer 510.

The reaction preventing layer 500 is made of a material that does not cause the process reaction with copper and aluminum. The reaction preventing layer is made of metal that allows a phase change reaction temperature when dissimilar metals, namely, a metal component of the reaction preventing layer 500 and another metal component come into contact with each other to be higher than a phase change reaction temperature when a copper component of the copper layer 520 comes into contact an aluminum component of the aluminum cooler.

According to the embodiment, the reaction preventing layer 500 may be made of steel that allows interface reaction temperature with the copper component of the copper layer 520 or the aluminum component of the aluminum cooler to be about 1100° C. or higher, but is not limited thereto. Furthermore, according to an exemplary embodiment of the present disclosure, the reaction preventing layer 500 may be made of nickel (Ni), but is not limited thereto. Moreover, according to an exemplary embodiment of the present disclosure, the auxiliary cooling plate of the three-layered structure illustrated in FIG. 4 may be made of a clad material, but is not limited thereto.

Figure 4:
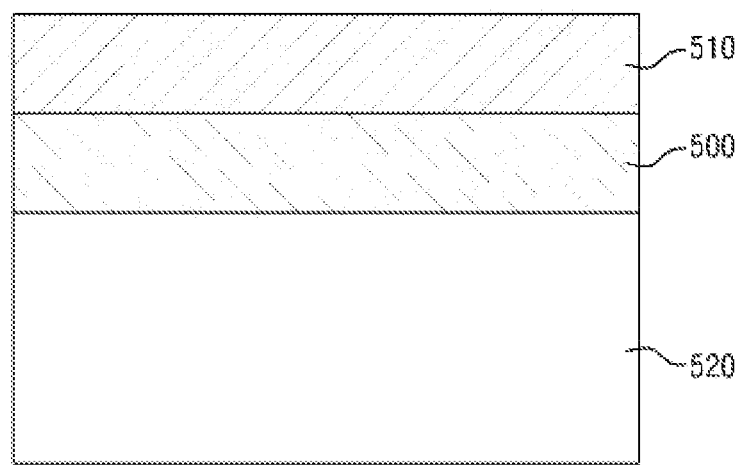
FIG. 4 is a schematic view illustrating an auxiliary cooling plate of a three-layered structure, according to an exemplary embodiment of the present disclosure.

If the auxiliary cooling plate of the three-layered structure illustrated in FIG. 4 according to an exemplary embodiment of the present disclosure is used, the problem of the interface reaction that may occur in the case of using the auxiliary cooling plate of the two-layered structure can be solved.

Although the preferred embodiments of the present disclosure have been disclosed for illustrative purposes, those skilled in the art will appreciate that various modifications, additions and substitutions are possible, without departing from the scope and spirit of the present disclosure as disclosed in the accompanying claims.

A cooling apparatus for a power semiconductor according to the present disclosure has an advantage in that it prevents an interface reaction from occurring when the cooling device of a two-layered structure having a copper layer and a filler layer is brazing welded to an aluminum cooler.

The effects which are to be achieved by the present disclosure are not limited to the above-mentioned effects, and other effects which are not mentioned above will be clearly understood by those skilled in the art from the following detailed description of the present disclosure.

What is claimed is:

1. A method of manufacturing a cooling apparatus for a power semiconductor, comprising:
    providing an auxiliary cooling plate of a multi-layered structure;
    providing a cooler having a cooling path so that a cooling medium flows therein; and
    joining the auxiliary cooling plate to a surface of the cooler with which the power semiconductor comes into contact,
    wherein the providing a cooler and the joining the auxiliary cooling plate are performed together in a same brazing process, so that a manufacture of the cooler and the joining the auxiliary cooling plate are simultaneously performed,
    wherein the providing a cooler is performed by an aluminum brazing process,
    wherein the providing the auxiliary cooling plate comprises:
        providing a copper layer;
        forming a reaction preventing layer on the copper layer to prevent an interface reaction between a copper component of the copper layer and an aluminum component of the cooler; and
        forming a filler layer, which is to be joined to the cooler, on the reaction preventing layer, and
    wherein the reaction preventing layer includes a metal, wherein a phase change reaction temperature when a metal component of the reaction preventing layer come into contact with the copper component of the copper layer or the aluminum component of the cooler is higher than a phase change reaction temperature when the copper component of the copper layer comes into contact with the aluminum component of the cooler.

2. The method of claim 1, wherein the metal component of the reaction preventing layer is nickel (Ni).

3. The method of claim 1, wherein the metal component of the reaction preventing layer is steel.

4. A cooling apparatus for a power semiconductor, comprising:
    a cooler including aluminum and having a cooling path so that a cooling medium flows therein; and
    an auxiliary cooling plate of a multi-layered structure joined to a surface of the cooler with which the power semiconductor comes into contact;
    wherein the auxiliary cooling plate has a multi-layered structure including:
        a copper layer;
        a reaction preventing layer disposed on the copper layer to prevent an interface reaction between a copper component of the copper layer and an aluminum component of the cooler; and
        a filler layer disposed on the reaction preventing layer to be joined to the cooler, and
    wherein the reaction preventing layer includes a metal, wherein a phase change reaction temperature when a metal component of the reaction preventing layer come into contact with the copper component of the copper layer or the aluminum component of the cooler is higher than a phase change reaction temperature when the copper component of the copper layer comes into contact with the aluminum component of the cooler.

5. The cooling apparatus of claim 4, wherein the metal component of the reaction preventing layer is steel.

6. The cooling apparatus of claim 4, wherein the metal component of the reaction preventing layer is nickel (Ni).

\* \* \* \* \*